United States Patent [19]
Pinneo

[11] Patent Number: 5,902,563
[45] Date of Patent: May 11, 1999

[54] RF/VHF PLASMA DIAMOND GROWTH METHOD AND APPARATUS AND MATERIALS PRODUCED THEREIN

[75] Inventor: John M. Pinneo, Mountain View, Calif.

[73] Assignee: Pl-Limited, Mountain View, Calif.

[21] Appl. No.: 08/960,929

[22] Filed: Oct. 30, 1997

[51] Int. Cl.[6] .................................................. B01J 03/06
[52] U.S. Cl. ........................... 423/446; 117/79; 117/929; 427/255.3
[58] Field of Search .............................. 117/79, 86, 929; 423/446; 427/249

[56] References Cited

U.S. PATENT DOCUMENTS

| 4,434,188 | 2/1984 | Kamo et al. ............................. 427/39 |
|---|---|---|
| 5,230,740 | 7/1993 | Pinneo ..................................... 118/723 |
| 5,324,553 | 6/1994 | Ovshinsky et al. ..................... 427/571 |

FOREIGN PATENT DOCUMENTS

06128748 A2   5/1994   Japan .

*Primary Examiner*—Felisa Hiteshew
*Attorney, Agent, or Firm*—Sierra Patent Group, Ltd.

[57] ABSTRACT

Processes are disclosed for performing non-microwave, non-arcjet plasma-assisted chemical vapor deposition of diamond in which substantially no particles impact the growing diamond surface with energies sufficient to prevent the growth of diamond. The energies of the particles are limited by selecting frequency, pressure, magnetic fields, electrical bias, or a combination thereof to the deposition region of the chamber. Diamond materials formed by these processes are also disclosed.

20 Claims, 6 Drawing Sheets

RF/VHF PLASMA DIAMOND GROWTH METHOD AND APPARATUS AND MATERIALS PRODUCED THEREIN

BACKGROUND OF THE INVENTION

1. Field of the Invention

The present invention relates to CVD diamond growth. More particularly, the present invention relates to CVD diamond growth using RF/VHF plasma techniques.

2. The Prior Art

It has been known that synthesis of diamond films can be accomplished using plasma activated chemical vapor deposition processes which now comprise a well-known body of art. Briefly, when energy is applied to a mixture of hydrogen and carbonaceous gases, under certain conditions of temperature, pressure, gas mixture ratio, and other known parameters, excited species are created in the gas excitation zone and are transported by diffusion to suitable substrate surfaces, where they cause films of high-purity polycrystalline diamond to nucleate and grow.

At the time of its discovery, this phenomenon was surprising because it was well known that diamond is not thermodynamically stable under ordinary conditions. The stable form of carbon at normal pressure and temperature is graphite, and the first successful synthesis of diamond was achieved by employing enormous pressure during crystallization under conditions in which diamond is the thermodynamically favored form. The art of low-pressure diamond deposition is now well established and is the basis for a number of commercial applications, including production of diamond-coated cutting tools and diamond microelectronic packages.

Excitation of the gases can take place through a variety of means, including combustion (oxyacetylene flames), heated filaments, plasma arcjets, and microwave plasma excitation. Each of these methods has its limitations. Combustion diamond CVD is not used commercially due to its high cost and difficulty of engineering large-scale deposition systems. Hot filament systems are used to coat tools with diamond, but suffer from low growth rates and from incorporation of filament materials as impurities in the growing diamond film. Plasma torch systems are used to synthesize diamond films, but suffer from high capital and operating costs, and are difficult to scale to deposition sizes greater than a few inches in diameter. Microwave plasma diamond CVD suffers from high capital equipment cost and restricted deposition area, the latter limitation arising from the relationship between plasma excitation zone size and microwave wavelength, in which the plasma zone is commonly limited to approximately ¼ to ½ the wavelength of the energy used to initiate the plasma.

In microwave diamond CVD, microwaves are admitted into a chamber filled with reactant gases. In all published systems, plasma ignition is achieved by causing resonant superposition of at least two microwaves. In many systems, such as those described in U.S. Pat. No. 4,434,188 and those subsequently derived from its teachings, a portion of the microwave energy admitted from one side of the reactor passes through the reaction region and is reflected from an adjustable opposing wall back into the reaction zone. The reflecting wall is adjusted to position the point of highest electric field at the locus of desired plasma ignition, and power is increased until plasma ignition occurs.

Operation of reactors in resonant cavity mode, in which reactor dimensions are at most a few multiples of the wavelength of the excitation energy, is necessitated by the requirements of diamond deposition chemistry. It is known empirically that diamond CVD does not proceed efficiently below operating pressures of approximately 10 Torr, and few if any commercial diamond CVD processes operate below 50 Torr. For example, production of bulk diamond slabs for cutting tools and heat spreaders, often done in plasma torch systems or large microwave CVD systems, takes place at pressures of 100 to 300 Torr. Because of the requirement for high pressure operation, high magnitude electric fields are needed to initiate ionization which is the basis for plasma formation. In consequence, many large-area plasma deposition technologies such as electron cyclotron resonance (ECR) cannot be used for diamond deposition because they do not operate at sufficiently high gas pressures. Resonant cavity operation provides the high electric fields needed to sustain plasmas at the high pressures required for synthesis of high quality diamond.

The need for resonant, standing-wave chamber and microwave technology fixes the physical extent of the plasma excitation region to not more than about one-half the wavelength of the excitation energy, more typically not more than one-quarter thereof. Thus, for the commercially important 915 Mhz microwave frequency, the resultant plasma in diamond CVD systems is about 4 inches in diameter under ordinary operating conditions. Various methods have been developed to circumvent some of the size constraints imposed in deposition of diamond using small microwave plasmas. These include using larger substrates in proximity to the plasma region, extending the plasma through shaping local electric fields, and moving the plasma rapidly across large substrates, as disclosed in U.S. Pat. No. 5,230,740 to Pinneo. These methods provide an ability to diamond coat articles up to about 10 inches in diameter at 915 Mhz with penalties in growth rates and/or deposition uniformity, but the basic difficulty engendered by small plasmas in microwave-driven diamond CVD systems has not been heretofore surmounted.

It would seem that a straightforward remedy for restricted plasma size would be to employ much lower excitation frequencies with longer wavelengths to achieve bigger plasmas. This was the reason for early work in using 13.56 Mhz sources for diamond CVD tests. At 13.56 Mhz, the free space wavelength is in excess of 22 meters, which would give quite large plasmas. In practice, deposition is usually accomplished by applying the RF (radio frequency) energy to an electrode which carries the object to be coated. Inductive coupling, in which a coil external to the chamber is energized with RF, has also been tried for diamond CVD. Neither of these modalities, both well-known to those skilled in the deposition art, has been successful in producing diamond films of usable quality, but rather produce films consisting of mixed forms of carbon, including graphite, amorphous carbon, and small diamond-bonded carbon domains. These films, depending on the properties they exhibit, are often termed "diamond-like carbon" (DLC) films. Their properties are in general inferior to those of diamond; DLC is softer, less conductive of heat, less stable at elevated temperatures, less electrically insulative, etc.

Plasma consists of ionized gases, that is, gases in which electrons have been temporarily removed from their parent molecules by the action of electric fields. Ionization produces the mix of negative, positive, and neutrally charged particles known as a plasma. The charged particles in a plasma are accelerated by electric fields. When alternating electric fields are present (as they are in RF or microwave excited plasmas), charged particles gather kinetic energy during one half of the alternating voltage cycle only to lose it through deceleration during the opposite half-cycle as the field polarity reverses. The more slowly the field reverses (i.e., the lower the driving frequency), the greater the acceleration time, and the greater the kinetic energy imparted to charged particles. At 13.56 MHz (RF), a small portion of the ion population can build up to several hundred electron volts energy.

Since even the strongest chemical bonds have energies less than about 5 eV, ions from RF sources have the energy to break all chemical bonds in materials with which they collide. In contrast, at 2450 MHz (microwave), ion energies are generally less than 10 eV. Microwave plasmas produce ions which have much lower energies and which therefore do not cause disorder when they impact surfaces.

The present inability to produce inexpensive diamond films for industrial use continues to inhibit the development of what otherwise would be a significant industry based on the routine engineering use of CVD) diamond.

It is an object of the present invention to provide a method for CVD deposition of diamond at frequencies below the microwave range.

It is another object of the present invention to provide a method for CVD deposition of diamond which allows depositions over larger areas than prior-art methods.

It is a further object of the present invention to provide a method for CVD deposition of diamond which overcomes some of the problems of the prior art.

It is yet another object of the present invention to provide a method for CVD deposition of diamond which is lower in cost than prior art CVD methods.

BRIEF DESCRIPTION OF THE INVENTION

Evolution of the CVD diamond industry has essentially stalled due to the lack of a low-cost, large-area deposition technology for the material. The present invention provides such a technology.

The present invention teaches the large-scale deposition of diamond through plasma CVD processes with reduced surface impact energies. The present invention comprises processes which cause the growth of diamond under conditions such that the growth region is not exposed to particles having energies sufficient to degrade or destroy the diamond. The present invention enables use of excitation energies which are much lower in frequency than the microwave frequencies disclosed in earlier art, and therefore allows the deposition of diamond over increased areas, with greatly improved economy of operation and reduction of diamond cost.

According to one aspect of the present invention, a method is provided for performing non-microwave, non-arcjet plasma-assisted chemical vapor deposition of diamond in which substantially no particles impact the growing diamond surface with energies sufficient to prevent the growth of diamond. In one embodiment of the invention according to this aspect of the invention, a method is provided for performing non-microwave, non-arcjet plasma-assisted chemical vapor deposition of diamond in which substantially no particles impact the growing diamond surface with energies greater than between about 50 electron volts and about 70 electron volts.

According to another aspect of the present invention, a method is provided for performing non-microwave, non-arcjet plasma-assisted chemical vapor deposition of diamond in which plasma ignition is achieved using RF energy having a frequency between about 1 MHz and about 50 MHz in which substantially no particles impact the growing diamond surface with energies sufficient to prevent the growth of diamond.

According to another aspect of the present invention, a method is provided for performing non-microwave, non-arcjet plasma-assisted chemical vapor deposition of diamond in which plasma ignition is achieved using VHF energy having a frequency between about between 50 MHz and about 300 MHz in which substantially no particles impact the growing diamond surface with energies sufficient to prevent the growth of diamond.

According to another aspect of the present invention, a method is provided for performing non-microwave, non-arcjet plasma-assisted chemical vapor deposition of diamond in which at least one magnetic field is employed during the method to maintain the energies of substantially all particles impacting the growing diamond surface to below energies sufficient to prevent the growth of diamond.

According to another aspect of the present invention, a method is provided for performing non-microwave, non-arcjet plasma-assisted chemical vapor deposition of diamond in which operating pressure in excess of about 50 Torr is employed during the method to assure that substantially no particles impact the growing diamond surface to below energies sufficient to prevent the growth of diamond.

According to another aspect of the present invention, a method is provided for performing non-microwave, non-arcjet plasma-assisted chemical vapor deposition of diamond in which a positive substrate bias in excess of 50 volts is employed during the method to ensure that substantially no particles impact the growing diamond surface to below energies sufficient to prevent the growth of diamond.

According to another aspect of the present invention, combinations of the above-recited techniques are used to ensure that substantially no particles impact the growing diamond surface to below energies sufficient to prevent the growth of diamond.

Another aspect of the present invention comprises diamond materials formed according to the methods of the present invention.

BRIEF DESCRIPTION OF THE DRAWING FIGURES

DETAILED DESCRIPTION OF A PREFERRED EMBODIMENT

Figure 1:
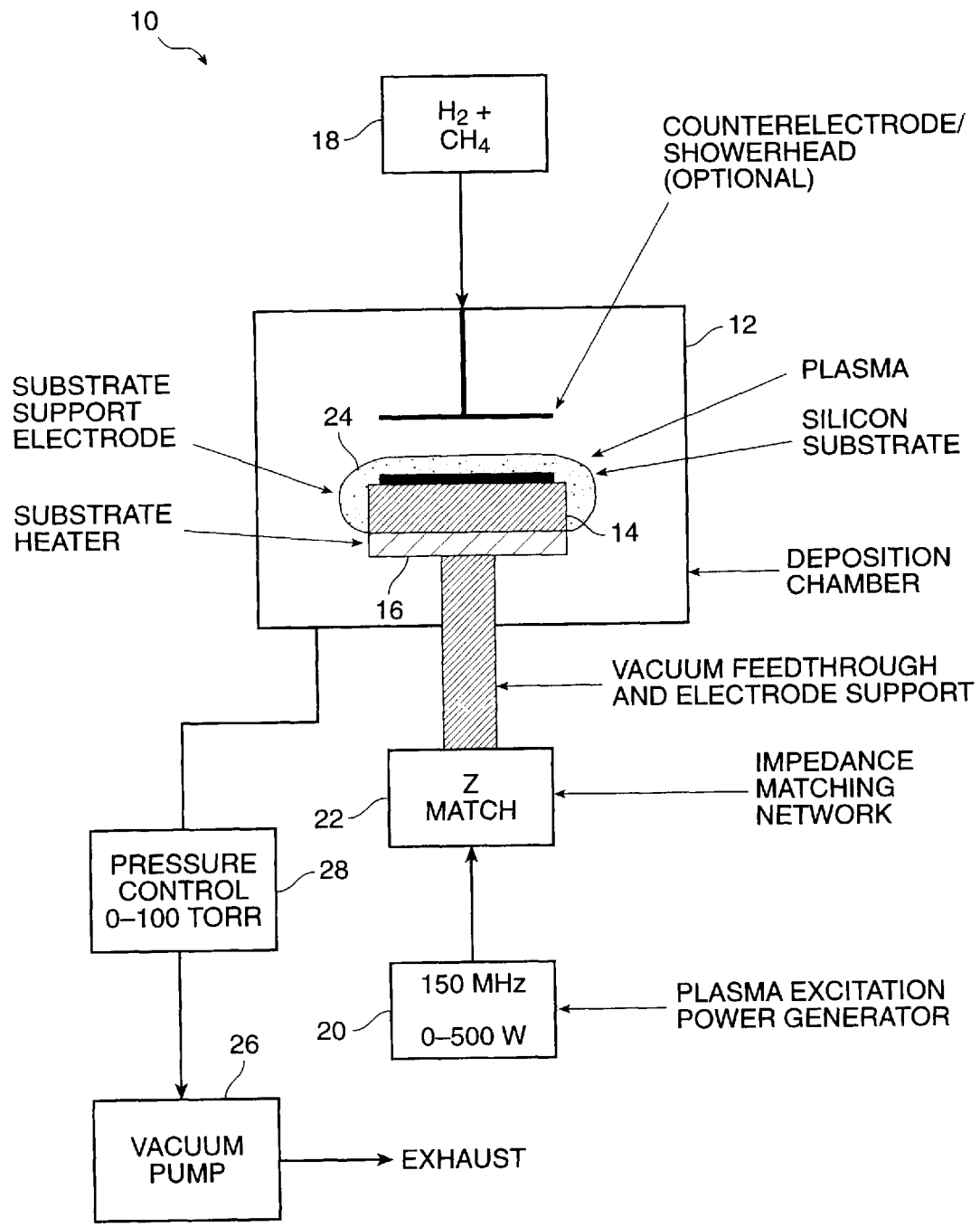
FIG. 1 is a diagram of a typical apparatus for CVD diamond growth according to a first aspect of the present invention using VHF energy for plasma excitation.

Those of ordinary skill in the art will realize that the following description of the present invention is illustrative only and not in any way limiting. Other embodiments of the invention will readily suggest themselves to such skilled persons.

The present invention exploits the appreciation by the inventor that earlier attempts to employ low excitation frequencies failed to achieve diamond CVD because of continuous destruction of the growing diamond material by high-energy ions which disrupt nascent diamond-bonded carbon nuclei, permitting only the formation of thermodynamically stable forms of carbon such as graphite or amorphous carbon. All diamond CVD processes operate at pressures far below the region of thermodynamic stability of diamond. Thus, if a chemical bond between two carbon atoms in a diamond crystal is disrupted, and the ambient pressure is low, the bond is statistically unlikely to re-form as a diamond bond, but will more probably reform as a graphitic ($sp^2$) bond. Restated, a diamond lattice cannot repair broken bonds through annealing mechanisms at ordinary ambient pressure.

In fixing the magnitude of the impact energy needed to damage or disorder a growing diamond lattice, it will be remembered by those skilled in the art that such an energy level is necessarily indistinct rather than sharply defined. This arises from several physical factors.

First, diamond lattices exhibit variation in resistance to particle bombardment damage as a function of their crystallographic orientation. A carbon atom on the surface of a [111] oriented diamond crystal lattice is bonded directly to three neighboring carbon atoms in the level immediately below the surface plane. In contrast, a surface carbon atom on a [100] oriented diamond crystal lattice is bonded directly only to two nearest neighbor subsurface carbon atoms, and is more readily displaced by impact than the [111] surface atom, for which three bonds must be broken. Therefore, the threshold of ion energy sufficient to disorder a diamond surface will vary in accord with the particular diamond crystal orientation under bombardment.

Second, the actual energy transferred to the diamond lattice varies as a function of the mass of the particles impacting the surface. As is well-known, momentum transfer between two colliding particles is most efficient when the two particles have identical mass, and diminishes as the difference in masses increases. Therefore, ion damage to a diamond surface will depend on the masses of impacting particles as well as their energies. Hydrogen ions will, other factors being constant, require much more energy to effect disorder of a diamond crystal than will carbon ions, the hydrogen ions having only one-twelfth the mass of carbon atoms in the diamond lattice.

Third, energy threshold values for ion-induced lattice disorder will vary with the direction of impact, with those impacts normal to the surface being most effective in transferring energy. Glancing, low-angle collisions of ions with the surface will transfer less energy to the surface and will induce less damage to the growing diamond crystal lattice.

As a result of these well-known physical factors, the combination of which may vary widely in a particular circumstance, it will be appreciated by those skilled in the art that the energy threshold which must not be exceeded in order to sustain growth of high quality diamond crystals necessarily varies significantly. For purposes of this disclosure 50 eV has been adopted as the nominal energy threshold for bombardment-induced diamond damage, recognizing that the actual threshold will be fixed by the particular conditions selected by the practitioner. Typical energy thresholds for bombardment-induced diamond damage encountered will be in the about 50 eV to about 70 eV range.

Several means are disclosed herein by which to achieve plasma-driven synthesis of diamond under circumstances which limit ion energy at the growth surface. Different embodiments of the present invention employ one or more of these effects to limit ion energy at the growth surface to values below the magnitude where diamond bonds are destroyed. It is presumed that persons of ordinary skill in the art are knowledgeable concerning the fundamentals of diamond deposition, including, but not limited to, general deposition materials, reagents, and procedures, substrate materials and their preparation to promote nucleation, reactor chamber materials selection and hygiene, and the ranges of process parameters employed in diamond deposition processes.

It is known that ion energy in continuous plasmas is closely related to the frequency of the excitation energy. In general, the higher the excitation frequency, the lower the average ion energy. This is due to the reduction in ion acceleration duration as the time between electric field reversals decreases with increasing frequency. Reduced acceleration duration leads to reduced ion kinetic energy. This parameter is important in diamond deposition because ions having energies in excess of between about 50 eV and about 70 eV destroy the diamond structure as they collide with diamond crystals during the growth process.

It is further known that ion energies at the diamond growth surface can be limited or reduced by providing a magnetic field having the appropriate magnitude and direction. Imposition of a magnetic field with components along all three spatial dimensions will impede the motion of charged particles in any direction, thereby limiting the kinetic energy which can be acquired by such particles while travelling to the diamond growth surface.

It is further known that ion energies at the diamond growth surface can be limited or reduced by increasing the plasma pressure. This effect proceeds from the increased probability of intermolecular collisions, the collisions serving to transfer kinetic energy from ions (which gain energy through acceleration by electric fields) to slower ions or neutrals, the latter being unaffected by electric or magnetic fields.

It is further known that imposition of an electrical bias potential on the growth surface, provided such bias is of the appropriate sign and magnitude, will prevent the impact of high-energy charged particles on the biased surface. For diamond growth, application of a positive bias of 500 volts will prevent the approach to the biased surface of positive ions up to approximately this energy level. Nonconductive surfaces (e.g., ceramics, plastics, glasses, etc.) can be effectively biased using RF bias techniques well-known in the art. It should be noted that the instances of DC bias-enhanced diamond growth which are contained in the prior art have been employed in microwave-driven plasmas, which do not contain highly energetic ions, and further, have been of the negative sign, which attracts rather than repels the most numerous classes of ions in the plasma, those which are positively charged. This effect tends to accelerate, rather than decelerate, any ions impacting the diamond growth surface.

It is known in the art of diamond CVD that diamond films can be grown across a broad range of operating parameters. Parameters known to be important in diamond CVD include: gas pressure, gas composition, gas flow rate, substrate temperature, plasma excitation power, plasma excitation frequency, and substrate area. The properties of diamond films grown within broad ranges of these parameters vary in a smooth and continuous manner, without exhibition of abrupt boundary conditions. The effects of varying these parameters are well known to persons of ordinary skill in the art.

With respect to gas pressure, it is known that operation of diamond CVD processes below approximately 10 Torr pressure gives rise to the deposition of admixtures of diamond and non-diamond carbon species such as graphite, amorphous carbon and the like, these materials having none or nearly none of the desirable material properties associated with diamond of high purity. It is further known that an effect of increasing gas pressure on diamond CVD is to provide enhanced material quality coupled with increasing diamond deposition rates, and diamond CVD is known to proceed successfully at pressures of approximately 300 Torr and higher. It is also known to be an effect of increasing gas pressure that the voltage levels needed to ignite and sustain a plasma increase. It is also known that a consequence of increasing gas pressure in the absence of increasing plasma excitation power is the shrinkage of the plasma to such a degree that coverage of the substrate becomes nonuniform and of no utility. Thus, for example, one skilled in the art of CVD diamond deposition would readily understand that operation of a diamond CVD process at 100 Torr would require greater plasma excitation power than operation of a process at 50 Torr with otherwise similar conditions.

With respect to gas composition, it is well known in the art of CVD diamond deposition that successful diamond deposition may be achieved using a wide variety of gas compositions, generally consisting of a carbon source gas, usually diluted in hydrogen, with additional gas species such as oxygen present in the mixture if needed to obtain particular process results. Thus it is known that diamond deposition proceeds readily using mixtures of methane in hydrogen ranging from about 0.1% to about 5.0% methane concentration. It is also well known that the quality and properties of the diamond material deposited in the CVD process vary greatly with the particular gas composition used.

In the instant example, with other parameters held constant, diamond produced using a 0.5% mixture of methane in hydrogen would grow slowly, but would exhibit very high purity (as evidenced by the nearly complete absence of non-diamond carbon species) and high thermal conductivity, whereas a diamond material grown using 5% methane in hydrogen would grow rapidly, but would exhibit significant amounts of non-diamond carbon species arising from the more rapid growth rate and would possess degraded thermal conductivity. Thus, a practitioner skilled in the art of diamond CVD would select from the wide range of available gas compositions those most suitable for production of diamond films with the desired properties and production economics.

With respect to gas flow rate, it is well-known in the art of diamond CVD that diamond deposition may be achieved over a wide range of gas flow rates, the specific flow rate being selected through balancing the desired process performance against process operating costs. Thus, diamond CVD proceeds at total gas flow rates as low as 10 sccm, giving small amounts of diamond at very low gas consumption costs, while diamond deposition also proceeds at flow rates of 10,000 sccm, giving much larger mass deposition rates at increased operating costs. The skilled practitioner will select a specific gas flow rate after due consideration of the desired result in light of the available art.

With respect to substrate temperature, it is known that diamond deposition can be carried out over a wide substrate temperature range, from approximately 300° Centigrade to over 1200° Centigrade. At low deposition temperatures, diamond CVD proceeds slowly, giving films with small crystallite sizes and high purity with respect to non-diamond carbon incorporation. At high deposition temperatures, other parameters being constant, high substrate temperatures yield more rapid diamond film growth, larger crystallites, and usually more incorporation of non-diamond impurities such as graphite or amorphous carbon. These properties affect the utility of diamond films for various applications, and the practitioner will therefore select a substrate temperature appropriate for producing films with those properties required for the specific application.

With respect to plasma excitation power, it is well known in the diamond CVD art that increased plasma power results in increased growth rate and increased substrate heating, all other parameters being equal. Thus, as little as 200 watts of plasma excitation power is adequate to demonstrate diamond CVD at a growth rate of approximately 0.1 microns per hour, while raising excitation power to 2000 watts, keeping other parameters constant, will increase the diamond growth rate to over 10 microns per hour, principally through production of higher concentrations of excited species and elevation of substrate temperature. The skilled practitioner will readily select a plasma excitation power level consistent with operation of the diamond CVD process to obtain the materials properties desired within the limitations of the deposition equipment.

With respect to the frequency of plasma excitation energy, it has been determined that increased frequency leads to reduced plasma ignition and sustaining power levels, to smaller plasma size, and, as taught herein, to reduced ion energy. Thus diamond deposition can be readily carried out between a frequency of about 50 MHz and about 300 MHz, with diamond material quality improving with increased frequency, while coverage area decreases with increased frequency. Thus the skilled practitioner will choose a plasma excitation frequency which produces a plasma coverage and diamond material quality consistent with the desired application.

With respect to substrate area, it is known that increased substrate area requires proportionally increased plasma excitation power to maintain constant deposition performance. For example, diamond deposition can be carried out on 0.5 inch diameter substrates at 25 Torr with 400 watts of excitation power, while equivalent process performance on a 4 inch diameter substrate will require sixty-four times as much power, or approximately 25,600 watts. Thus the skilled practitioner will select a plasma power which will maintain plasma ignition over the entire substrate area to be coated and which will produce a diamond film of properties sufficient for the specific application at an acceptable rate.

From the foregoing disclosure and from the known art, it will be appreciated by persons of ordinary skill in the art that the complex, graded response of the diamond CVD process to variations in process parameters implies that the operable ranges of process parameters necessarily exhibit indistinct boundaries. Therefore, parameters outside the ranges discussed herein may be operable, depending on the practitioner's criteria for judging process utility in a specific application.

With the foregoing in mind, several examples of CVD diamond growth processes according to the present invention are set forth herein. Persons of ordinary skill in the art will readily recognize that these examples are illustrative and not limiting in nature. From this disclosure, persons of ordinary skill in the art will be readily enabled to practice the present invention without being limited to the specific examples given herein.

In the examples which follow, similar deposition apparatus is employed. From the following description of the deposition apparatus, persons of ordinary skill in the art will be readily enabled to practice the present invention.

A CVD deposition chamber is employed in all examples. The chamber is constructed of materials compatible with diamond CVD processes, such as aluminum or stainless steel. Chamber walls are typically water cooled to maintain structural integrity and operational safety. The chamber provides isolation between the process and ambient atmosphere, as well as support for internal components. The chamber additionally functions to contain RF energy supplied therein to drive the deposition process. A typical chamber for diamond CVD processes as described herein is cylindrical, with an internal diameter of 15 inches, and an internal height of 9 inches.

The chamber may optionally include a combination counterelectrode and gas delivery "showerhead". This component is a disc-shaped structure, and is usually water-cooled. This component serves as a ground electrode opposite the RF-energized substrate, and contributes to the ionization of gases to form a plasma near the substrate surface. Additionally, the counterelectrode can serve as a gas introduction device by delivering gas to the substrate through a plurality of holes within its face. This component is constructed in accord with standards familiar to those skilled in the art of CVD equipment manufacture, and may be made of aluminum or molybdenum, which are compatible with diamond CVD processes.

A conventional vacuum pump is employed to extract gases which pass through a pressure throttle valve, and remove these gases to an exhaust stack, where the gases are mixed with ambient air. Control of gas pressure within the chamber is accomplished using conventional downstream throttling equipment. The equipment consists of a pressure transducer which measures chamber gas pressure, a controller which reads the transducer output and which sends control signals to a vacuum valve, located upstream of the vacuum pump.

A plasma power generator is used to generate VHF or RF energy by conventional methods, using either solid-state or vacuum tube oscillators and amplifiers. As will be appreciated by persons of ordinary skill in the art, such generators include a means for smoothly varying power level throughout their range of deliverable power. They also include measurement means, such as power and SWR metering, to display power output and the extent to which such power is reflected from the load under conditions in which the load impedance is poorly matched to the generator. Such generators may be procured from a wide variety of manufacturers, or may be constructed by those skilled in the art according to well-known principles of design.

An impedance matching network provides an electrical impedance match between the output of the plasma generator and the vacuum electrical feedthrough by which VHF and RF energy is transmitted to the substrate support electrode. The impedance matching network consists of two variable capacitors (typically of the vacuum variable type) and at least one inductor, connected in the common "pi"-network configuration well known to those skilled in the art of delivery of VHF and RF energy efficiently to loads. As an example, for operation at 150 MHz, and for feedthrough electrode structures less than approximately 20" in overall length, variable capacitors should be chosen to provide variable capacitance between about 3 picoFarads and about 40 picoFarads, while the inductor should provide about 7 microhenrys of inductance. Components should be rated in accord with the power level desired.

In order to introduce the VHF or RF energy into the deposition chamber, a vacuum feedthrough and electrode support is provided. This structure provides a means for admitting VHF or RF energy to the deposition chamber, conducting said energy to the substrate support electrode, and maintaining vacuum isolation from the ambient atmosphere. Suitable feedthrough electrodes can be procured from manufacturers thereof, or can be constructed by those skilled in the art from readily available materials.

The substrate to be coated with diamond is disposed on a substrate support electrode structure fabricated from suitable materials. A flat, circular substrate, such as a silicon or molybdenum wafer, may be supported on a disc. The disc must withstand high temperatures, should exhibit good electrical conductivity, and must be compatible with diamond CVD process chemistry. Two materials known to be suitable for use in fabricating this component are molybdenum and tungsten. Typically, the support electrode is fabricated with a recess to provide positive location and retention of the substrate.

Process gases, typically methane and hydrogen, are delivered to the chamber using common mass flow controllers. These components, well known to those skilled in the art of chemical vapor deposition, accurately meter gases into the chamber in accord with the desired process recipe.

A heater element is furnished to heat the substrate to provide an independent means for establishing desired substrate temperature. This heater element is controlled by a controller which measures the output of a thermal sensor, such as an infrared pyrometer, which provides an indication of the substrate temperature. Typical heater elements consist of electrically heated wires encapsulated in ceramic coatings mounted on the substrate support electrode structure. Such heaters and their associated control components are widely available from many manufacturers.

The following examples of diamond deposition according to the present invention employ the apparatus generally described in the preceding paragraphs. Those of ordinary skill in the art will understand that the examples provided herein are illustrative only and are not intended to limit the scope of the present invention. Where additional components are employed in the CVD diamond growth processes disclosed herein, they are described with reference to the drawing figures. To the extent that drawing figures include elements which are identical to corresponding elements in previous drawing figures, these elements will be designated by the same reference numerals as used in the previous drawing figures.

EXAMPLE 1

Referring now to FIG. 1, according to an embodiment of the present invention, apparatus for CVD diamond deposition employs VHF energy to ignite a plasma. Apparatus 10 for performing CVD diamond deposition according to this aspect of the present invention includes a metallic chamber 12 which is capable of operation at reduced pressure, and which contains a substrate support 14. The chamber is cooled, such as by a water jacket (not shown) as is known in the art, to enable it withstand process operating temperatures.

Means, such as a transparent viewing window, are provided for observation by external observers and/or sensors for monitoring process parameters as is well known in the art. Means 16 for controlling the substrate temperature, such as electrical resistance heaters, are provided. A source of reactant gases, and apparatus for controlling gas pressure, shown schematically at reference numeral 18, are provided as is well known in the art.

VHF energy is generated in VHF source 20 and is introduced into the chamber such that the VHF energy is applied to the substrate with little reflection loss as is also well known in the art, such as by incorporation of an impedance matching network 22. As used herein, VHF energy means energy having a frequency in the range of from about 50 MHz to about 300 MHz.

By way of example, according to a method for carrying out this aspect of the present invention, a suitable substrate 24, such as a silicon wafer two inches in diameter which has been treated to induce diamond nucleation by means well-known in the art, is placed on the substrate support 14 and the chamber 12 is sealed. A mixture of hydrogen and methane in the volume ratio of about 97 to about 3 is introduced at a combined total flow rate of about 100 standard cubic centimeters per minute (sccm) from gas delivery system 18, with chamber pressure initially established at about 1 Torr using vacuum pump 26 and pressure controller 28. The substrate temperature is raised to about 800° Centigrade by substrate heater 16.

VHF energy at a frequency of about 150 MHz and an initial power of about 100 watts is generated by VHF generator 20 and is coupled into to the chamber 12 by matching network 22 and thereby applied to the substrate 24. VHF power is increased if needed until ignition of a plasma is noted. VHF power and gas pressure are then increased in a covariant manner such that pressure is allowed to increase to about 100 Torr while maintaining the plasma over the entire substrate 24. VHF power will be found to have increased to at least 500 watts as a requirement of maintaining plasma ignition, and the ultimate steady-state VHF power level will be determined by the empirical requirements of maintaining substrate temperature at about 800° Centigrade and maintaining plasma ignition over the entire substrate 24.

Under the conditions noted, a typical steady-state VHF power level is about 2,000 Watts. Operation is carried out for a duration determined by the desired diamond film thickness, in this case for 8 hours. On cessation of the deposition, a diamond film is found to have deposited on the substrate 24 to a thickness in excess of 20 micrometers.

EXAMPLE 2

Figure 2:
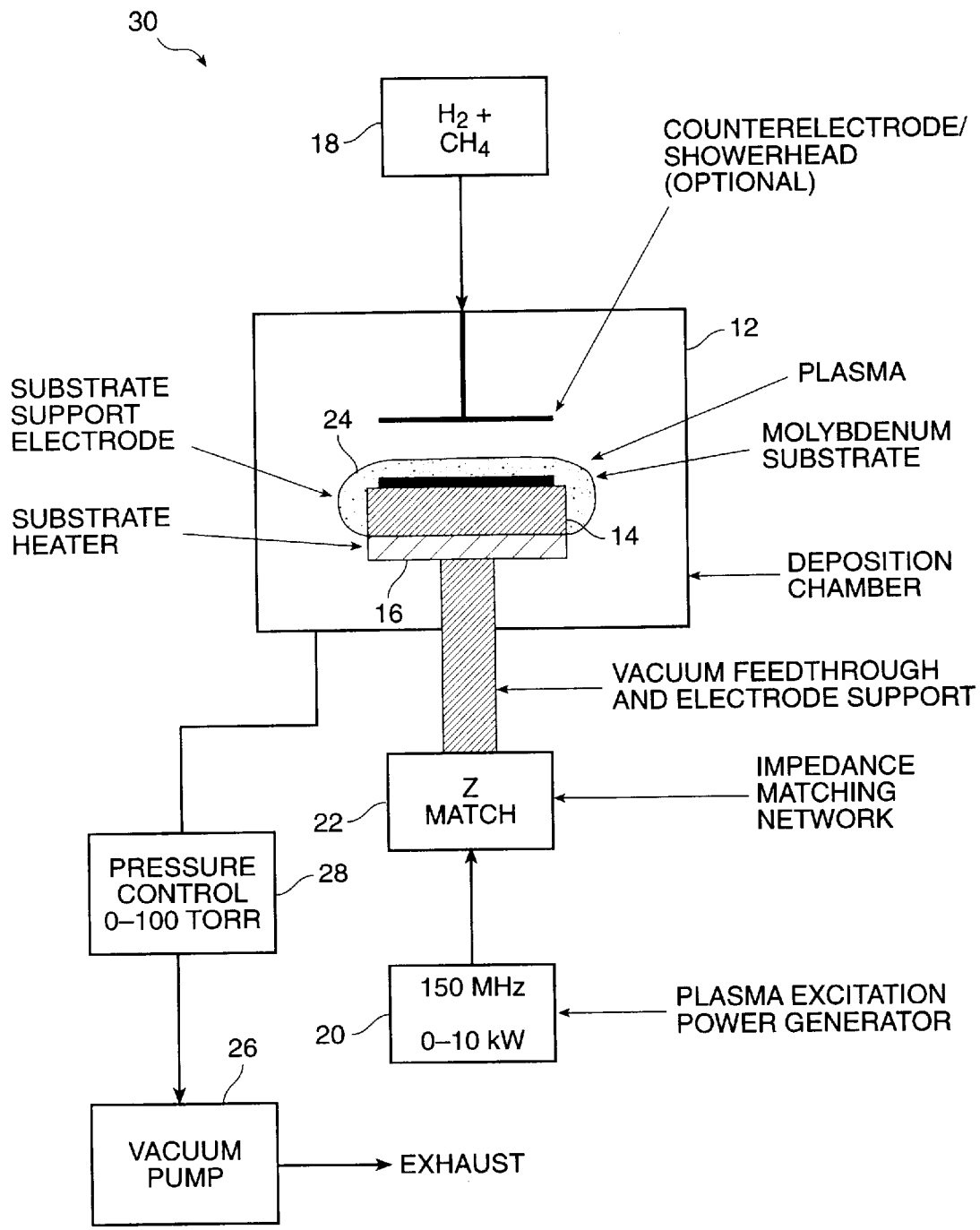
FIG. 2 is a diagram of a typical apparatus for CVD diamond growth according to the first aspect of the present invention using RF energy at elevated power for plasma excitation to achieve increased deposition area.

Referring now to FIG. 2, according to another embodiment of the present invention, apparatus for CVD diamond deposition over a large area employs VHF energy to ignite a plasma.

Apparatus for performing CVD diamond deposition according to this aspect of the present invention includes a suitably sized (e.g. 18 inches in diameter) metallic reaction chamber 12 which is capable of operation at reduced pressure. The apparatus may be another respects similar to the apparatus disclosed in Example 1 herein, and thus includes substrate holder 14, substrate heater 16, gas delivery system 18, VHF generator 20, impedance matching network 22, vacuum pump 26 and pressure controller 28.

By way of example, according to a method for carrying out this aspect of the present invention, a suitable substrate 24, such as a molybdenum disc twelve inches in diameter, which has been treated to induce diamond nucleation by means well-known in the art, is placed on the substrate support 14. A mixture of hydrogen and methane in the volume ratio of about 97 to about 3 is introduced at a combined total flow rate of about 100 standard cubic centimeters per minute (sccm) from gas delivery system 18, with chamber pressure initially established at about 1 Torr using vacuum pump 26 and pressure controller 28. The substrate temperature is raised to about 800° Centigrade using substrate heater 16.

VHF energy at a frequency of about 150 MHz and an initial power of about 500 watts is generated by VHF generator 20 and is coupled into to the chamber 12 by matching network 22 and thereby applied to the substrate 24. VHF power is increased if needed until ignition of a plasma is noted. VHF power and gas pressure are then increased in a covariant manner such that pressure is allowed to increase to about 100 Torr while maintaining the plasma over the entire substrate 24. VHF power will be found to have increased to at least 500 watts as a requirement of maintaining plasma ignition, and the ultimate steady-state radio frequency power level will be determined by the empirical requirements of maintaining substrate temperature at about 800° Centigrade and maintaining plasma ignition over the entire substrate 24.

Under the conditions noted, a typical steady-state VHF power level is about 10,000 Watts. Operation is carried out for a duration determined by the desired diamond film thickness, in this case for about 8 hours. On cessation of the deposition, a diamond film is found to have deposited on the substrate 24 to a thickness in excess of 10 micrometers.

EXAMPLE 3

Figure 3:
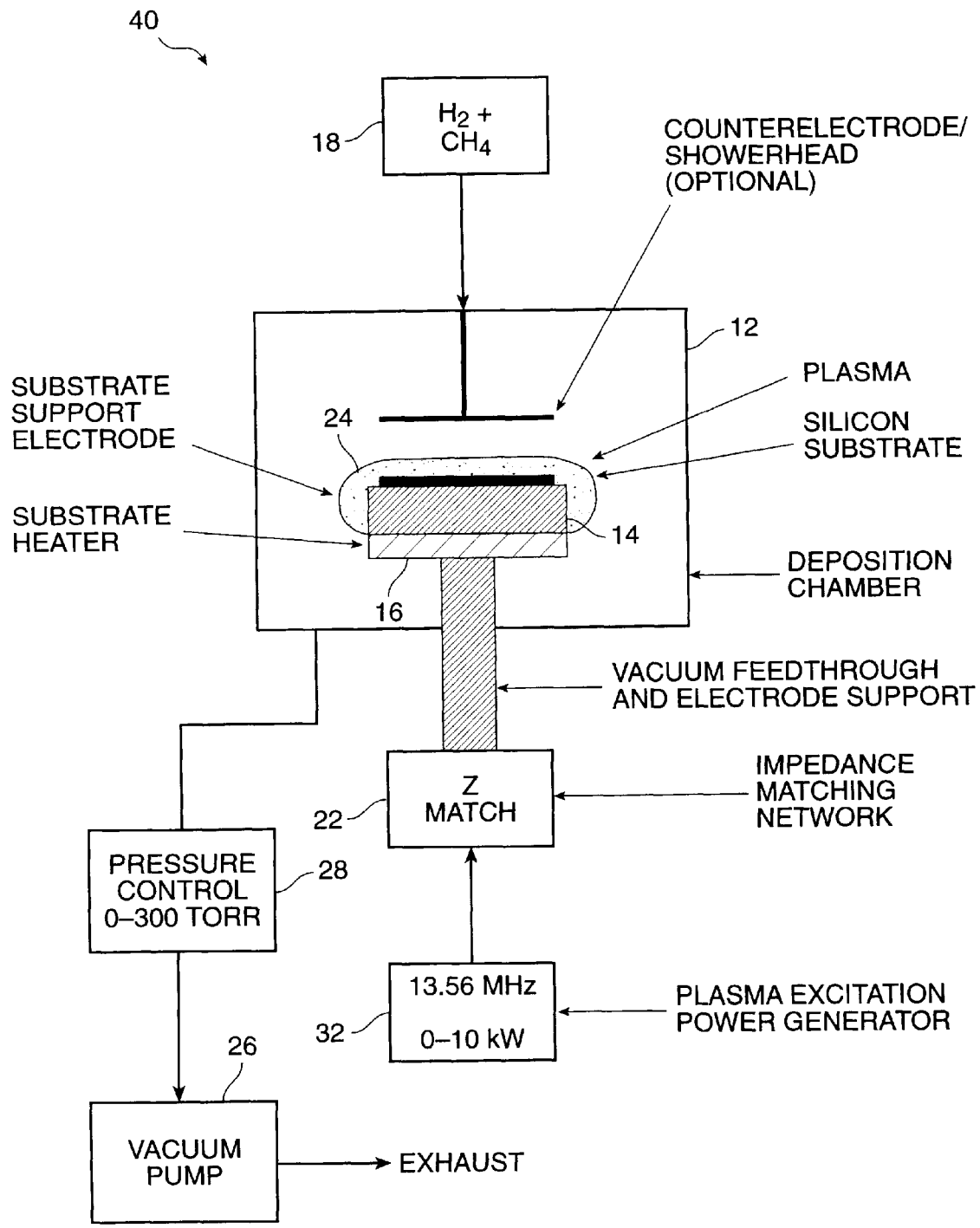
FIG. 3 is a diagram of a typical apparatus for CVD diamond growth according to another aspect of the present invention using RF energy for plasma excitation and an operating pressure in excess of about 50 Torr for limiting the energy of diamond growth ions.

According to another aspect of the present invention diamond deposition according to the present invention is carried out using RF energy at high pressure, as illustrated in FIG. 3. Apparatus 40 for performing CVD diamond deposition according to this aspect of the present invention includes a metallic reaction chamber 12 which is capable of operation at reduced pressure. The apparatus may be in other respects similar to the apparatus disclosed in Example 1 herein, and thus includes substrate holder 14, substrate heater 16, gas delivery system 18, vacuum pump 26 and pressure controller 28. According to this embodiment of the present invention, pressure controller 28 will be selected to provide pressures in a range of about 0 to 300 Torr.

The apparatus is altered to provide RF energy from RF generator 32 rather than VHF energy into the chamber. The term RF energy as used herein means energy having a frequency in the range of from about 1 MHz to about 50 MHz. RF generators for supplying RF energy are well known in the art. An impedance matching network 22 is provided to minimize reflected power loss as is known in the art. The inductor and capacitor values for impedance matching network 22 are selected for the frequency range employed as well known in the RF art.

A suitable substrate 24, such as a silicon wafer two inches in diameter which has been treated to induce diamond nucleation by means well-known in the art, is placed on the substrate support 14. A mixture of hydrogen and methane in the volume ratio of about 97 to about 3 is introduced at a combined total flow rate of about 100 standard cubic centimeters per minute (sccm) from gas delivery system 18, with chamber pressure initially established at about 1 Torr using vacuum pump 26 and pressure controller 28. The substrate temperature is raised to about 800° Centigrade using substrate heater 16.

RF energy at a frequency of about 13.56 MHz and an initial power of about 500 watts is generated by RF generator 32 and is coupled into to the chamber 12 by matching network 22 and thereby applied to the substrate 24. RF power is increased until ignition of a plasma is noted. RF power and gas pressure are then increased in a covariant manner such that pressure is allowed to increase to about 300 Torr while maintaining the plasma over the entire substrate 24. RF power will be found to have increased to at least 3000 watts as a requirement of maintaining plasma ignition, and the ultimate steady-state RF power level will be determined by the empirical requirements of maintaining substrate temperature at about 800° Centigrade and maintaining plasma ignition over the entire substrate 24.

Under the conditions noted, a typical steady-state RF power level is about 5,000 Watts. Operation is carried out for a duration determined by the desired diamond film thickness, in this case for about 8 hours. On cessation of the deposition, a diamond film is found to have deposited on the substrate 24 to a thickness in excess of 30 micrometers.

EXAMPLE 4

Figure 4:
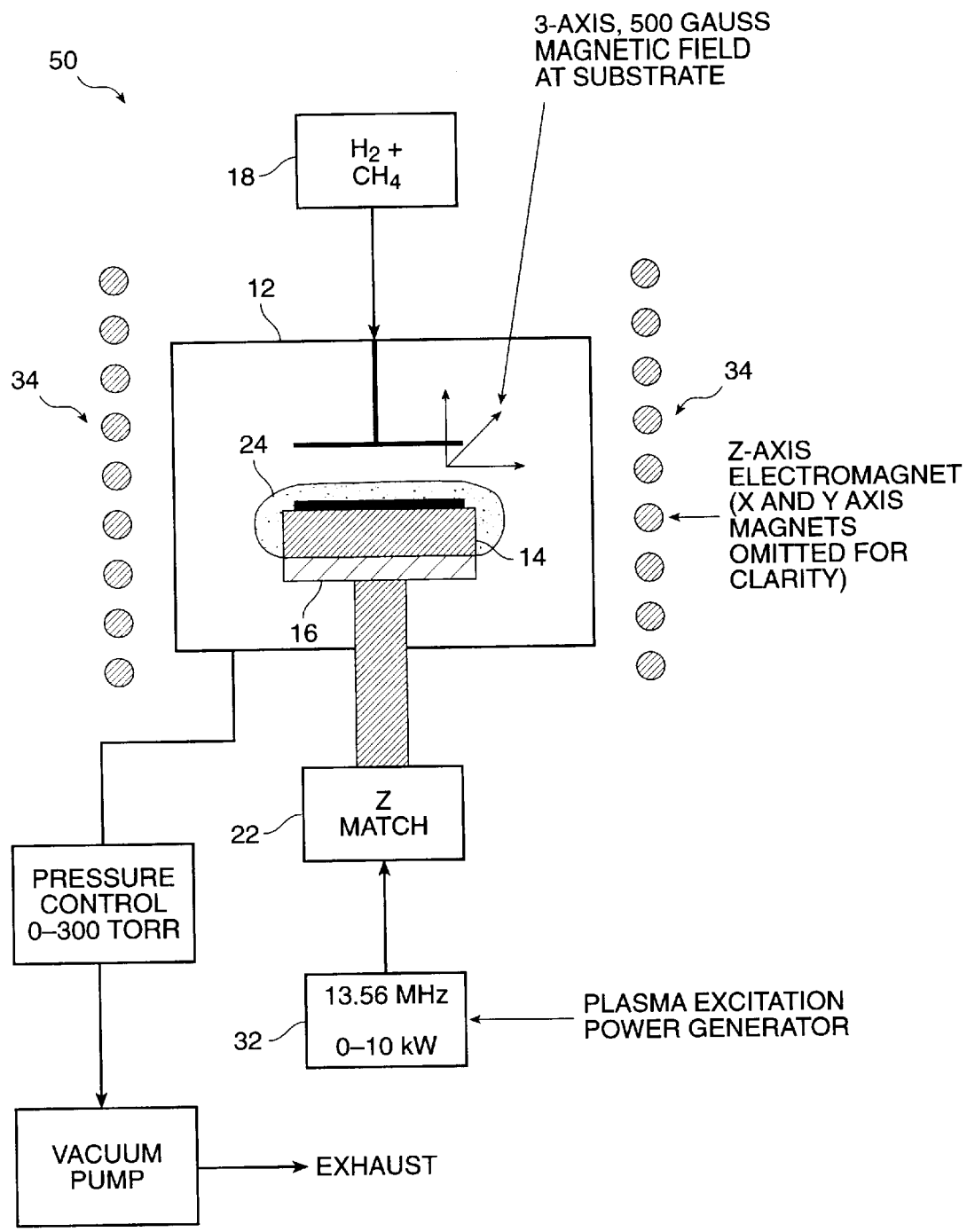
FIG. 4 is a diagram of a typical apparatus for CVD diamond growth according to another aspect of the present invention using RF energy for plasma excitation and a magnetic field for limiting the energy of diamond growth ions.

According to another aspect of the present invention illustrated in FIG. 4 herein, diamond deposition according to the present invention is carried out using RF energy and magnetic fields. Deposition apparatus 50 is employed in the process of the present example and to the extent it has been described in Example 3 herein, it will not be redescribed.

The deposition apparatus 50 of this embodiment of the invention is additionally provided with means for applying a three-axis magnetic field at the growth surface such that each spatial dimension has a magnetic field component. Such means may include three mutually perpendicular electromagnets oriented such that they impose a magnetic field having a field strength of at least about 500 gauss in each of the three spatial dimensions when measured at or near the growth surface. In FIG. 4, the coil comprising electromagnet 34 is shown in cross-section and is oriented to generate a magnetic field in the Z-axis (vertical) direction in the chamber. The electromagnets in the other two axis directions have been omitted to avoid unnecessarily obscuring the drawing figure. Design and construction of such electromagnets is a straightforward task for persons of ordinary skill in the art.

A suitable substrate 24, such as a silicon wafer two inches in diameter which has been treated to induce diamond nucleation by means well-known in the art, is placed on the substrate support 14. A mixture of hydrogen and methane in the volume ratio of 97 to 3 is introduced at a combined total flow rate of 100 standard cubic centimeters per minute (sccm) from gas delivery system 18, with chamber pressure initially established at 1 Torr by vacuum pump 26 and pressure controller 28. The substrate temperature is raised to about 800° Centigrade by substrate heater 16.

Power is applied to the three mutually perpendicular electromagnets in a manner well known in the art such that a three-axis magnetic filed is generated at the substrate 24 with an intensity of at least 500 Gauss when measured on any of the three spatial axes. RF energy at a frequency of about 13.56 MHz and an initial power of about 500 watts is generated by RF generator 32 and is coupled into to the chamber 12 by matching network 22 and thereby applied to the substrate 24. The RF power is increased until ignition of a plasma is noted. The RF power and gas pressure are then increased in a covariant manner such that pressure is allowed to increase to about 100 Torr while maintaining the plasma over the entire substrate 24. The RF power will be found to have increased to at least 500 watts as a requirement of maintaining plasma ignition, and the ultimate steady-state RF power level will be determined by the empirical requirements of maintaining substrate temperature at about 800° Centigrade and maintaining plasma ignition over the entire substrate 24.

Under the conditions noted, a typical steady-state RF power level is about 2,000 Watts. Operation is carried out for a duration determined by the desired diamond film thickness, in this case for about 8 hours. On cessation of the deposition, a diamond film is found to have deposited on the substrate 24 to a thickness in excess of 20 micrometers.

Persons of ordinary skill in the art will appreciate that, although the greatest effect will be obtained by use of a three-axis magnetic field, imposition of a single magnetic field with its component normal to the diamond growth surface will cause the path of a charged particle approaching the surface to spiral about the normal field vector, reducing the component of the momentum of the particle in the direction normal to the deposition surface, thereby reducing momentum transfer to, and damage of, the growing diamond surface.

EXAMPLE 5

According to another aspect of the present invention diamond deposition according to the present invention is carried out using RF energy in combination with an electrical bias applied to the substrate 24. Deposition apparatus 60, as illustrated in FIG. 5 is employed in the process of the present example and to the extent it has been described in Example 3 herein, it will not be redescribed.

Figure 5:
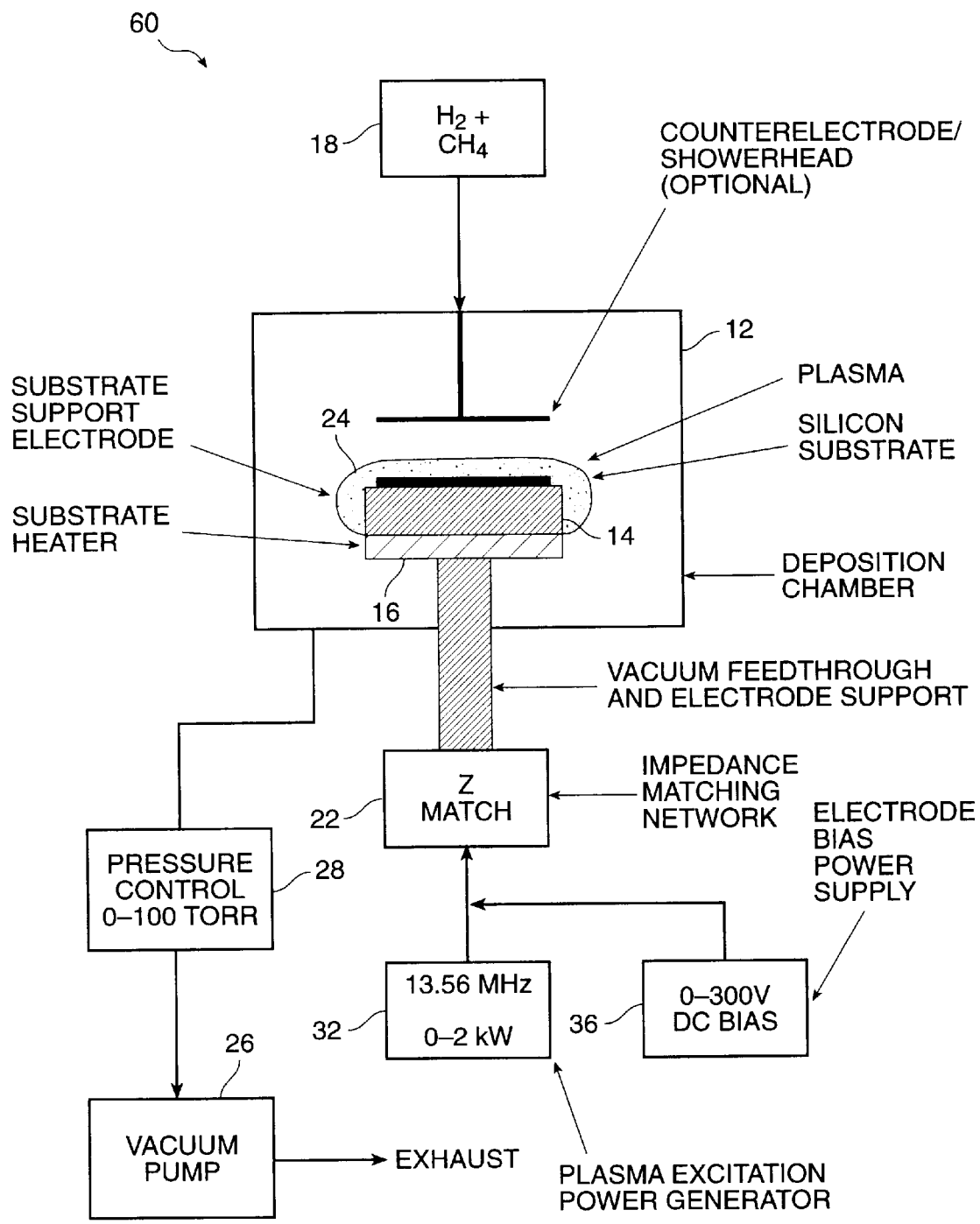
FIG. 5 is a diagram of a typical apparatus for CVD diamond growth according to another aspect of the present invention using RF energy for plasma excitation and a positive substrate bias for limiting the energy of diamond growth ions.

Deposition apparatus 60 of FIG. 5 is additionally provided with means for applying electrical bias to the substrate 24. Such means may include a separate, adjustable dc bias voltage supply 36 coupled into the RF energy feedline with an appropriate blocking isolator as is well-known in the art.

A suitable substrate 24, such as a silicon wafer two inches in diameter which has been treated to induce diamond nucleation by means well-known in the art, is placed on the substrate support 24. A mixture of hydrogen and methane in the volume ratio of 97 to 3 is introduced at a combined total flow rate of 100 standard cubic centimeters per minute (sccm), from gas delivery system 18 with chamber pressure initially established at 1 Torr using vacuum pump and pressure controller 28. The substrate temperature is raised to 800° Centigrade using substrate heater 16.

RF energy at a frequency of 13.56 MHz and an initial power of 100 watts is generated in RF generator 32 and is coupled into to the chamber by matching network 22 and thereby applied to the substrate 24. A positive DC electrical bias of about 300 volts is applied to the substrate 24 from DC bias supply 36. The RF power is increased until ignition of a plasma is noted. The RF power and gas pressure are then increased in a covariant manner such that pressure is allowed to increase to 100 Torr while maintaining the plasma over the entire substrate 24. The RF power will be found to have increased to at least 1000 watts as a requirement of maintaining plasma ignition, and the ultimate steady-state RF power level will be determined by the empirical requirements of maintaining substrate temperature at 800° Centigrade and maintaining plasma ignition over the entire substrate 24.

Under the conditions noted, a typical steady-state RF power level is 2,000 Watts. Operation is carried out for a duration determined by the desired diamond film thickness, in this case for 8 hours. On cessation of the deposition, a diamond film is found to have deposited on the substrate 24 to a thickness in excess of 20 micrometers.

Figure 6:
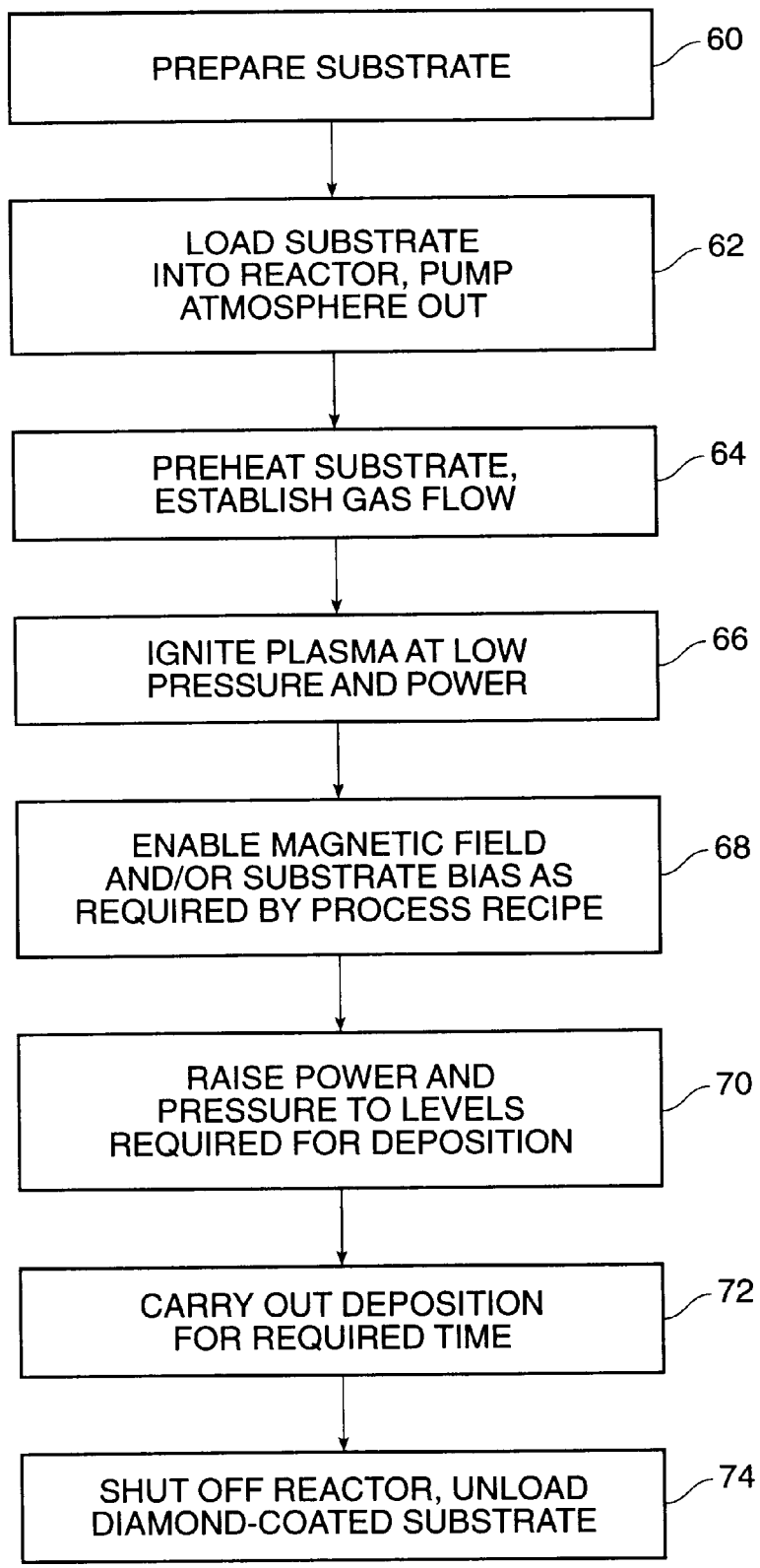
FIG. 6 is a flow diagram generically illustrating the CVD diamond growth processes according to the present invention.

Referring now to FIG. 6, a flow diagram generically illustrates the CVD diamond growth process of the present invention. The flow diagram of FIG. 6 is applicable to the processes disclosed in Examples 1 through 5 herein, wherein steps applicable to particular examples are appropriately noted.

First, at step 60, the substrate is prepared for diamond deposition. Numerous substrate preparation techniques for diamond film adhesion are known in the art. As presently preferred, the substrate is prepared by mildly abrading or polishing the substrate deposition surface with a diamond abrasive consisting of diamond grains of approximately 1 micrometer in diameter for approximately two minutes, followed by cleaning of excess abrasive material from the abraded surface using common solvent or soap and water methods.

Next, at step 62, the substrate is loaded into the reaction chamber, the chamber is sealed, and the atmosphere in the reaction chamber is pumped down to the desired pressure.

After the pressure in the reaction chamber reaches the desired value, the substrate is heated and the gas flow started at step 64. At step 66, the plasma is ignited at low power and low pressure.

At step 68, the magnetic field is enabled if the process of Example 4 is being practiced, or the substrate bias is applied if the process of Example 5 is being practiced, otherwise the process proceeds directly to step 70, where the power and pressure are raised to levels required for diamond deposition.

At step 72, the deposition process is carried out for a time sufficient to grow a film of a desired thickness. After the diamond film has reached the desired thickness, the reaction is shut down, the reaction chamber vented to the outside atmosphere, and the diamond coated substrate removed from the reaction chamber at step 74.

It will be apparent to those skilled in the art that variations and extensions of the forgoing embodiments are suggested and included in this invention. Such variations and extensions as the use of single- or two-axis magnetic fields to limit ion energy, the use of RF substrate bias in place of, or in combination with, DC bias, the use of counterelectrodes to enhance plasma ignition efficiency, and the like, and combinations of the above-disclosed techniques are contemplated.

A useful consequence of the present invention is that low frequency excitation radiation can be used to produce the plasma required for diamond deposition, this plasma being much larger in physical extent than those available using the microwave and arcjet prior-art methods.

A further useful consequence of the present invention is that diamond deposition can be carried out using powered electrodes, rather than the resonant chamber methodology of the prior microwave art. This simplifies equipment design and locates the plasma immediately adjacent to the growth surface, thereby enhancing diamond deposition rate over that of the prior-art methods.

Furthermore, deposition uniformity is improved by using an RF plasma deposition system as disclosed herein, resulting in increased product yield. Because of the lack of microwave propagation constraints, there is an expanded range of design for diamond CVD reactors.

The system cost is reduced, in that VHF and RF power sources are cheaper (on a $/watt basis) than microwave CVD diamond systems. There is an increased potential to scale processes to greater size, because VHF and RF power sources are available in higher power ranges than are microwave systems.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for performing non-microwave, non-arcjet, plasma-assisted chemical vapor deposition of diamond in which substantially no particles impact a growing diamond surface with energies sufficient to prevent the growth of diamond.

2. The method of claim 1 in which a plasma ignition is achieved using VHF energy having a frequency between about between 50 MHz and about 300 MHz.

3. A diamond material produced according to the method of claim 2.

4. The method of claim 1 in which at least one magnetic field is employed during said method to maintain the energies of substantially all particles impacting the growing diamond surface to below energies sufficient to prevent the growth of diamond.

5. A diamond material produced according to the method of claim 4.

6. The method of claim 1 in which operating pressure in excess of 50 Torr is employed during said method to assure that substantially no particles impact the growing diamond surface with energies sufficient to prevent the growth of diamond.

7. A diamond material produced according to the method of claim 6.

8. The method of claim 1 in which a positive substrate bias in excess of 50 volts is employed during said method to ensure that substantially no particles impact the growing diamond surface with energies sufficient to prevent the growth of diamond.

9. A diamond material produced according to the method of claim 8.

10. A diamond material produced according to the method of claim 1.

11. A method for performing non-microwave, non-arcjet, plasma-assisted chemical vapor deposition of diamond in which substantially no particles impact a growing diamond surface with energies greater than between about 50 electron volts and about 70 electron volts.

12. The method of claim 11 in which a plasma ignition is achieved using VHF energy having a frequency between about between 50 MHz and about 300 MHz.

13. A diamond material produced according to the method of claim 12.

14. The method of claim 11 in which at least one magnetic field is employed during said method to maintain the energies of substantially all particles impacting the growing diamond surface to below between about 50 electron volts and about 70 electron volts.

15. A diamond material produced according to the method of claim 14.

16. The method of claim 11 in which an operating pressure in excess of 50 Torr is employed during said method to assure that substantially no particles impact the growing diamond surface with energies greater than between about 50 electron volts and about 70 electron volts.

17. A diamond material produced according to the method of claim 16.

18. The method of claim 11 in which a positive substrate bias in excess of about 50 volts is employed during said method to ensure that substantially no particles impact the growing diamond surface with energies greater than between about 50 electron volts and about 70 electron volts.

19. A diamond material produced according to the method of claim 18.

20. A diamond material produced according to the method of claim 11.

* * * * *